(12) United States Patent
Zare et al.

(10) Patent No.: US 11,624,904 B2
(45) Date of Patent: Apr. 11, 2023

(54) VAPOR AS A PROTECTANT AND LIFETIME EXTENDER IN OPTICAL SYSTEMS

(71) Applicant: KLA Corporation, Milpitas, CA (US)

(72) Inventors: David Jalil Zare, San Jose, CA (US); Eduardo Soto, Patterson, CA (US); I-Fan Wu, Fremont, CA (US); Joseph Walsh, Soquel, CA (US); Kent McKernan, San Jose, CA (US); Joseph Armstrong, Fremont, CA (US); Christopher Davis, San Rafael, CA (US); Garry Rose, Livermore, CA (US); Damon Kvamme, Los Gatos, CA (US); Bernd Burfeindt, Los Gatos, CA (US); Ali Ehsani, San Ramon, CA (US)

(73) Assignee: KLA Corporation, Milpitas, CA (US)

( * ) Notice: Subject to any disclaimer, the term of this patent is extended or adjusted under 35 U.S.C. 154(b) by 675 days.

(21) Appl. No.: 16/533,366

(22) Filed: Aug. 6, 2019

(65) Prior Publication Data
US 2021/0041689 A1 Feb. 11, 2021

(51) Int. Cl.
G02B 27/00 (2006.01)
H01S 3/036 (2006.01)
G01N 21/15 (2006.01)
H01L 21/66 (2006.01)

(52) U.S. Cl.
CPC ......... *G02B 27/0006* (2013.01); *G01N 21/15* (2013.01); *H01S 3/036* (2013.01); *G01N 2021/151* (2013.01); *H01L 22/30* (2013.01)

(58) Field of Classification Search
None
See application file for complete search history.

(56) References Cited

U.S. PATENT DOCUMENTS

| | | | |
|---|---|---|---|
| 6,327,294 B1 * | 12/2001 | Kojima | H01S 3/109 372/101 |
| 6,724,460 B2 | 4/2004 | Van Schaik et al. | |
| 7,426,030 B1 | 9/2008 | Liphardt et al. | |
| 9,116,445 B2 | 8/2015 | Germanenko et al. | |
| 2003/0161365 A1 * | 8/2003 | Perry | H01S 3/20 372/39 |
| 2005/0066893 A1 * | 3/2005 | Soininen | C23C 16/4482 118/715 |
| 2006/0285091 A1 | 12/2006 | Parekh et al. | |
| 2011/0310922 A1 | 12/2011 | Ko et al. | |
| 2014/0014138 A1 | 1/2014 | Spiegelman et al. | |

(Continued)

FOREIGN PATENT DOCUMENTS

JP 2007157837 A 6/2007
TW 200931561 A 7/2009

OTHER PUBLICATIONS

WIPO, ISR for PCT/US2019/047803, dated Dec. 6, 2019.

(Continued)

*Primary Examiner* — Edwin C Gunberg
(74) *Attorney, Agent, or Firm* — Hodgson Russ LLP

(57) ABSTRACT

An enclosure surrounding the optical component can be connected with a vapor source. The vapor source can provide a vapor to the enclosure with a vapor level from 500 ppm to 15000 ppm. The concentration of vapor in the enclosure can increase the lifespan of the optical component in the enclosure.

12 Claims, 8 Drawing Sheets

(56) References Cited

U.S. PATENT DOCUMENTS

2014/0146838 A1* 5/2014 Germanenko ...... G03F 7/70008
    372/34

OTHER PUBLICATIONS

EPO, Supplementary European Search Report for EP Application No. 19856120, dated Feb. 17, 2022.
TIPO, Office Action for TW Application No. 108130612, Jan. 12, 2023.

* cited by examiner 800-2200ppm vapor

VAPOR AS A PROTECTANT AND LIFETIME EXTENDER IN OPTICAL SYSTEMS

FIELD OF THE DISCLOSURE

This disclosure relates to lifetime improvements for lasers and optical systems.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer that are separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

Defect review typically involves re-detecting defects that were detected by an inspection process and generating additional information about the defects at a higher resolution using either a high magnification optical system or a scanning electron microscope (SEM). Defect review is typically performed at discrete locations on specimens where defects have been detected by inspection. The higher resolution data for the defects generated by defect review is more suitable for determining attributes of the defects such as profile, roughness, or more accurate size information.

Wafer inspection systems typically employ illumination sources of deep ultraviolet (DUV) radiation with wavelengths as short as 260 nanometers with a high numerical aperture (NA). Wavelengths of 193 nanometers or even 120 nm also can be used. In some examples, illumination light may be provided by an arc lamp. For example, electrode based, relatively high intensity discharge arc lamps are used in inspection systems. In some other examples, illumination light is provided by a laser. One approach to realize the desired short wavelength emission has been the harmonic upconversion of longer wavelength sources.

Optics and laser lifetime improvements are needed to enable next generation semiconductor manufacturing. Previously, a vapor-free gas was used to prevent damage to the optical components in inspection systems. For water, vapor-free meant 20 ppm or less of water. For other species, vapor-free meant low ppb levels. The physics and chemistry of these vapor-free purge gases can limit lifetimes for optics especially in high intensity conditions.

Therefore, improved techniques for optics and laser lifetime improvements are needed.

BRIEF SUMMARY OF THE DISCLOSURE

An system is provided in a first embodiment. The system includes an optical component and an enclosure surrounding the optical component. A vapor source is in fluid communication with the enclosure. The vapor source provides a vapor to the enclosure with a vapor level from 500 ppm to 15000 ppm, wherein the vapor is one of water, methanol, ethylene glycol, or ethanol.

In an instance, the optical component is one of $CaF_2$, $MgF_2$, $LiF_2$, $BaF_2$, $SrF_2$, or $BeF_2$. In another instance, the optical component is one of fused silica, quartz, a borate, germanium, silicon germanium, rutile, sapphire, silicon, $YVO_4$, $SrB_4O_7$, or ZnSe. In yet another instance, the optical component is one of a borosilicate, an AMTR and zinc selenide material, $SrB_4O_7$, or $YVO_4$.

The vapor level can be from 500 ppm to less than 2000 ppm, from 500 ppm to less than 5000 ppm, or from greater than 5000 ppm to 15000 ppm. In an instance, the vapor for these ranges is water, but also may be methanol, ethylene glycol, or ethanol.

The vapor source can include a bubbler, a permeable membrane, a semi-permeable membrane, a charge mosaic member, or a bipolar membrane. The permeable membrane can include Nafion or a polyamid.

The vapor source can include a gas source. The gas source provides nitrogen, helium, carbon monoxide, carbon dioxide, krypton, argon, xenon, hydrogen, oxygen, compressed dry air, or a mixture thereof. The gas from the gas source is mixed with the vapor.

The system can further include a vapor sensor disposed in fluid communication with the enclosure. The vapor sensor is one of a carbon monoxide detector, a carbon dioxide detector, a hygrometer, or a hydrogen sensor. The system also can include a processor in electronic communication with the vapor sensor. The processor is configured to adjust the vapor level in purge gas from the enclosure based on readings from the vapor sensor.

A method is provided in a second embodiment. The method comprises flowing a vapor from a vapor source to an enclosure that surrounds an optical component. A vapor level in the purge gas is maintained from 500 ppm to 15000 ppm, wherein the vapor is one of water, methanol, ethylene glycol, or ethanol.

The optical component may be one of $CaF_2$, $MgF_2$, $LiF_2$, $BaF_2$, $SrF_2$, or $BeF_2$.

The vapor level may be from 500 ppm to less than 2000 ppm, from 500 ppm to less than 5000 ppm, or from greater than 5000 ppm to 15000 ppm.

The method can further include measuring the vapor level in the enclosure using a vapor sensor disposed in the enclosure. Maintaining the vapor level can be based on readings from the vapor sensor.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Assorted vapor gases can help with optics damage in semiconductor inspection tools, semiconductor metrology tools, and other tools with optical components. The chosen vapor or vapors may do more than merely serve as a cooling fluid to conduct heat away from an object. In the embodiments disclosed herein, the vapors can stop a process that damages the optics at the surface. Thus, the vapor can prevent the physics and chemistry of the damage from occurring. This contrasts with a previous belief that these vapors contributed to optics damage.

Through experiments, it was determined that some vapors stopped or decreased the rate of surface and near-surface damage on optics where a strong field was present that damaged the optics and caused the propagating laser beam to change shape (e.g., the recognition of damage) or affected other measurable qualities of the propagating laser beam. In this physics and chemistry, adding vapors to the area surrounding a laser crystal or optics can help stabilize and prolong the life of a laser crystal and optics.

For near-surface damage, most of the light-driven energy exchange may occur in the first approximately 50-100 nm of the optics. This can drive a larger material change that goes at least 1 micron into the surface of the optics.

The choice of vapor and its concentration can depend on the material the optic is made from and/or the wavelengths and intensity levels of the illumination light. For example, $MgF_2$ is water soluble, so a lower concentration of water may be needed or an alcohol may be used instead of water to avoid water damage to the $MgF_2$ optical component. In another example using water-soluble optical components, water may be kept low enough to not cause solvation of the optical component, but high enough to stop the damage process. Other vapors such as alcohols also can be used to prevent damage and alcohols may be less likely to cause solvation of the optical component. In yet another example, if 193 nm light is used, then water can be used instead of alcohol. An alcohol may grow contamination too quickly on the surface at this wavelength. Alcohols may work fine at low intensity, but at high intensity alcohols may not stick to the surface well enough due to local heating. Thus, water may be used at high intensity because water has a much greater surface sticking efficiency.

Figure 1:
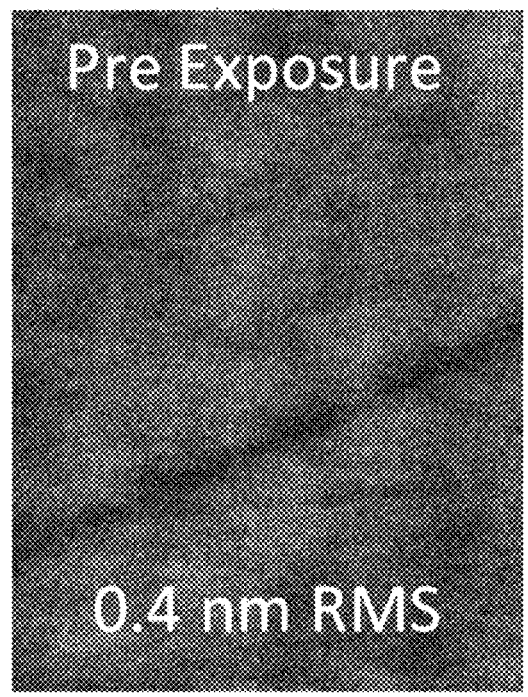
FIG. 1 illustrates an optical component before exposure.
Figure 2:
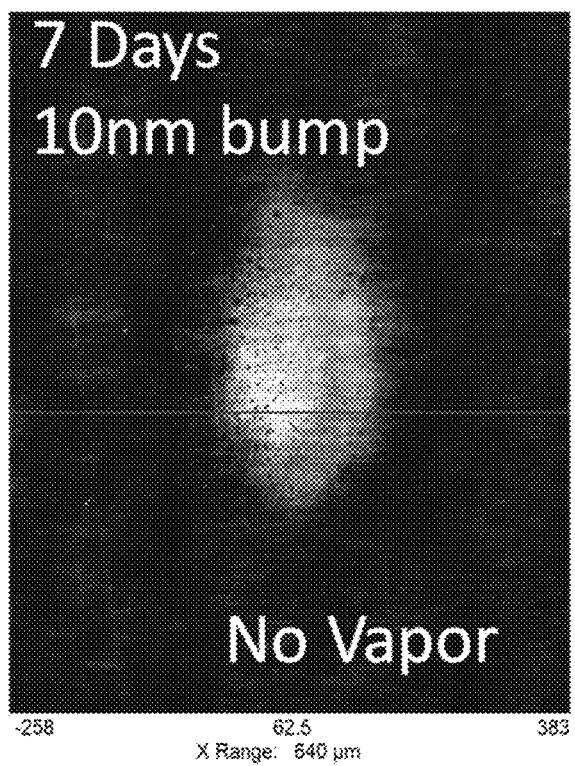
FIG. 2 illustrates test results of an optical component after 7 days of exposure without vapor.
Figure 3:
FIG. 3 illustrates test results of an optical component after 68 days of exposure with vapor.

As an example, adding vapor to the environment around an optical component, an optical component that typically lasts only 5-10 days before being damaged beyond the specification will last noticeably longer. FIG. 1 illustrates an optical component before exposure to photons. FIG. 2 illustrates test results of an optical component after 7 days of exposure without vapor present. A 10 nm bump formed in the center of the optical component. This negatively affects operation and/or lifetime of the optical component. FIG. 3 illustrates test results of an optical component after 68 days of exposure with vapor present. The optical component of FIG. 3 does not illustrate damage like the optical component of FIG. 2. The optical component of FIG. 3 has approximately 0.1 nm surface roughening. In the example of FIG. 3, from 800 ppm to 2200 ppm vapor was used. Thus, by exposing the optical component to the vapor, approximately $\frac{1}{100}^{th}$ of the surface damage occurs in 10× the time for this example.

Vapor can affect many mechanisms of damage, including reducing surface temperatures, blocking damaging surface chemistries (e.g., oxidation), or affecting other drivers for the observed physical changes. These mechanisms are merely examples, and other mechanisms to improve optical component lifetime in the presence of vapor may be possible.

Figure 4:
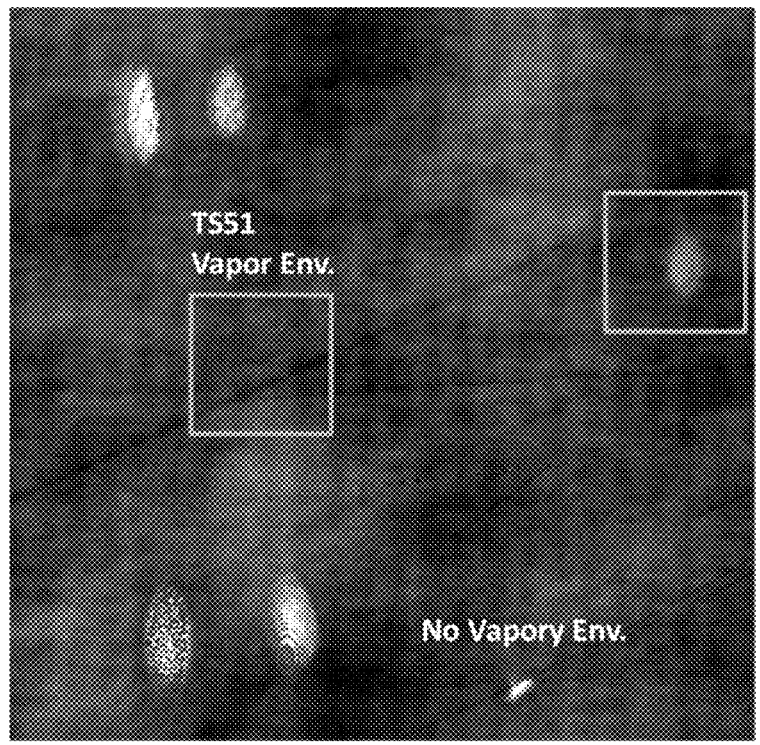
FIG. 4 illustrates an observable different in surface damage/modification between a damage spot where no vapor was present and a damage spot where the vapor was present.

FIG. 4 illustrates an observable different in surface damage/modification between a damage spot where no vapor was present and a damage spot where the vapor was present. The spot with the vapor shows no discernable damage in a 10× longer time period than the site with no vapor present.

Figure 5:
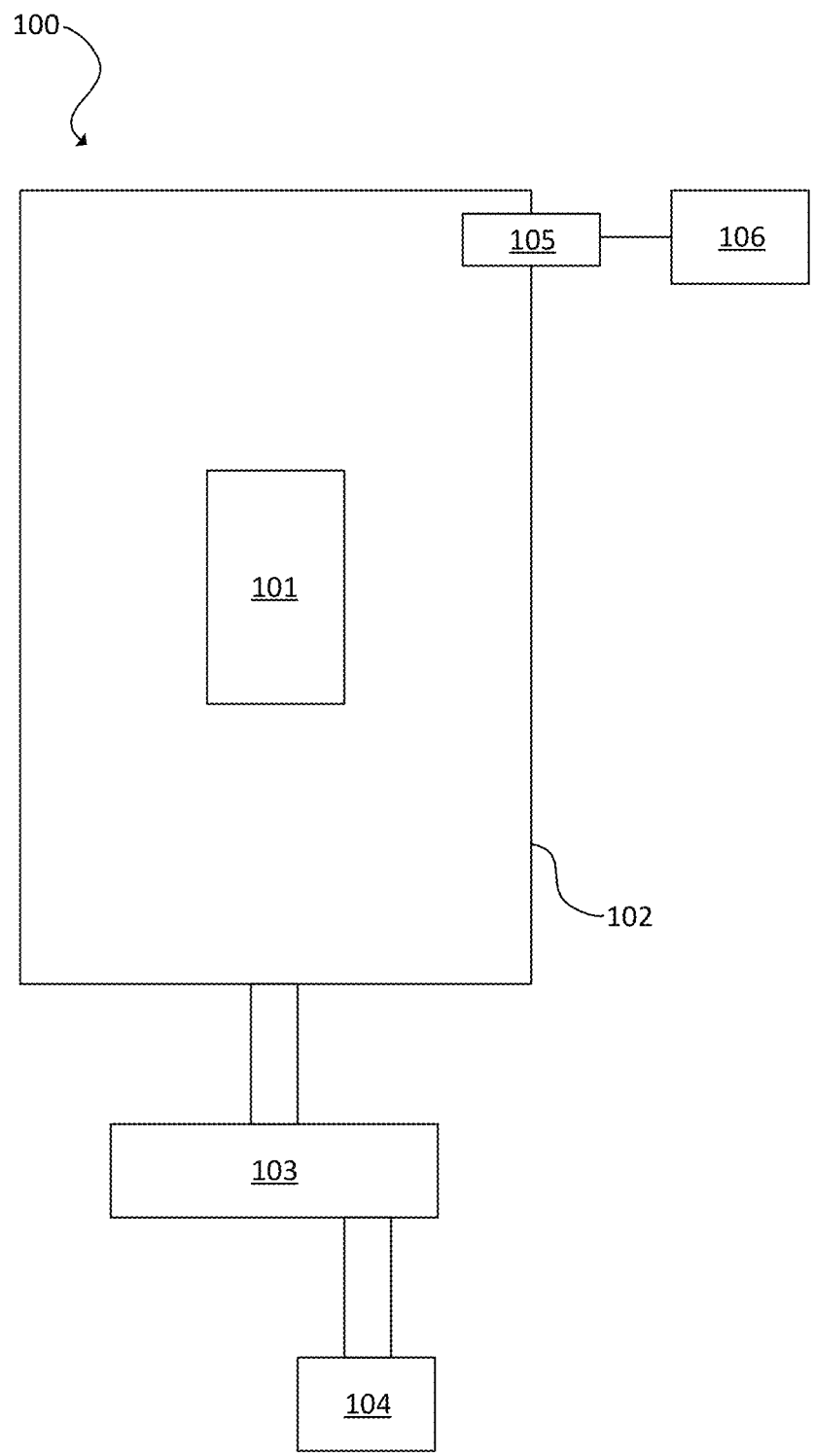
FIG. 5 is a block diagram of an embodiment of a system in accordance with the present disclosure.

FIG. 5 is a block diagram of an embodiment of a system 100. An optical component 101 is disposed in an enclosure 102. The enclosure 102 surrounds the optical component 101.

The optical component 101 may be one of a borosilicate, AMTR (manufactured by Newport) and zinc selenide materials, silicon germanium, sapphire, $MgF_2$, $LiF_2$, $CaF_2$, $BaF_2$, $SrF_2$, $SrB_4O_7$ (SBO), or $BeF_2$. The optical component 101 also may be one of fused silica of any grades and type, quartz, a borate (e.g., barium borate (BBO)), germanium, rutile, sapphire, silicon, $YVO_4$, or ZnSe. Other materials are possible.

The optical component 101 may be used in operation at high fluence. 193 nm, 213 nm, 248 nm, 265 nm, 266 nm, or 2 μm light may be incident on the optical component 101. Broad band light from a bulb or open plasma source may be used. Other wavelengths are possible including more ionizing x-rays.

A vapor source 103 is in fluid communication with the enclosure 102. The vapor source 103 provides vapor to the enclosure 102 with levels from ppb to high ppm levels (e.g., 10's of thousands) to slow or halt optics or crystal damage. For example, the vapor level can be from 500 ppm to 15000 ppm, including all values to the 1.0 ppm and ranges between.

In an instance, the vapor level is from 500 ppm to less than 2000 ppm. In yet another instance, the vapor level is approximately 2000 ppm. In yet another instance, the vapor level is approximately 5000 ppm. The concentration of vapor in the environment can arrest the physics and/or chemistry that leads to optics damage. For example, effects of high electric fields caused by intense laser light can be mitigated. The rate of damage to the optics can be reduced by at least 100× through use of the correct vapor/material combination in the optical environment as disclosed herein. For example, levels at 5000 ppm or more may be acceptable for $CaF_2$, but may not be acceptable for $MgF_2$.

Vapors can be added to the environment in gas form. For example, the vapor source 103 can include a bubbler. Liquid evaporation can add a desired vapor concentration to the gas purge. Bubblers can produce a consistent amount of vapor in the environment.

The vapor source 103 may be a pressurized gas cylinder.

The vapor source 103 also can use a permeable membrane. The permeable membrane can include Nafion, a polyamide, or other permeable materials. The permeable membrane, which may be a tube, a diaphragm, or a wall adjacent to the environment, preferentially pulls targeted vapor from the adjacent vapor-rich reservoir into the controlled optical environment.

Nafion is an example of a permeable membrane. Nafion allows polar molecules to pass from the vapor-rich air to a vapor-poor purge gas stream. The vapor concentration in the purge gas can be measured and controlled to yield a specified concentration in the optical environment.

The permeable membrane also can be a nylon co-polymer of high-density polyethylene (HDPE) or a polyolefin. The permeable membrane also can be an acetal, acrylonitrile, or functionalized polyvinyl chloride (PVC).

The vapor source 103 also can use a semi-permeable membrane, a charge mosaic membrane, or a bipolar membrane.

In an instance, the vapor source 103 includes a gas source 104. The gas source 104 can provide one or more of nitrogen, helium, carbon monoxide, carbon dioxide, krypton, argon, xenon, hydrogen, oxygen, compressed dry air, or a mixture of these gases that is mixed with the vapor.

A vapor sensor 105 can be disposed in fluid communication with the enclosure 102. The vapor sensor 105 can be disposed in the enclosure 102 or along a vapor supply path to the enclosure 102. The vapor sensor 105 may be, for example, a hydrogen sensor, hygrometer, carbon monoxide detector, or a carbon dioxide detector. A processor 106 can be in electronic communication with the vapor sensor 105. The processor 106 can adjust the vapor level in the enclosure based on readings from the vapor sensor 105.

Embodiments of the system disclosed herein can be implemented on any laser system or plasma-based light source system.

Figure 6:
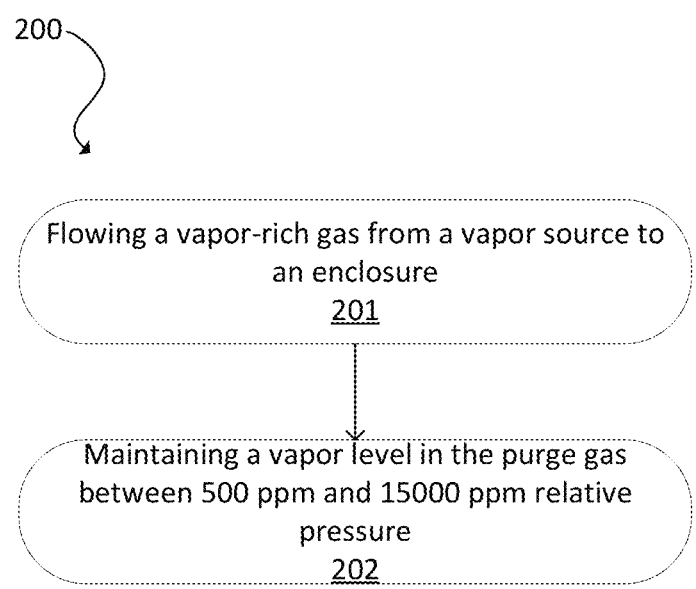
FIG. 6 is a flowchart of an embodiment of a method in accordance with the present disclosure.

FIG. 6 is a flowchart of an embodiment of a method 200. A vapor-rich gas flows from a vapor source to an enclosure that surrounds an optical component at 201. The optical component may be one of $CaF_2$, $MgF_2$, $LiF_2$, $BaF_2$, $SrF_2$, $BeF_2$, or other materials. The environment around the optical component in the enclosure may include at least one of nitrogen, helium, carbon monoxide, carbon dioxide, krypton, argon, xenon, hydrogen, oxygen, or compressed dry air, or a mixture of these gases.

At 202, a vapor level in a gas is maintained from ppb levels to approximately the condensation concentration of the vapor under atmospheric conditions of a use case (e.g., pressure, temperature, concentration of vapor, and gas mixes therein), such as from 500 ppm to 15000 ppm vapor. In an instance, the vapor levels are from 500 ppm to less than 2000 ppm vapor. In another instance, the vapor level is from greater than 5000 ppm to 15000 ppm. For example, a vapor level is from greater than 5000 ppm to 15000 ppm can provide improved results for a $CaF_2$ optical component and a vapor level from 500 ppm to less than 2000 ppm can provide improved results for $MgF_2$.

In a particular embodiment, the vapor level is from greater than 6000 ppm to 15000 ppm, from greater than 7000 ppm to 15000 ppm, from greater than 8000 ppm to 15000 ppm, from greater than 9000 ppm to 15000 ppm, from greater than 10000 ppm to 15000 ppm, from greater than 11000 ppm to 15000 ppm, from greater than 12000 ppm to 15000 ppm, from greater than 13000 ppm to 15000 ppm, or from greater than 14000 ppm to 15000 ppm.

The vapor level may be added to the gas or maintained in the gas using a bubbler or a permeable membrane.

In an instance, the vapor level in the enclosure is measured using a vapor sensor disposed in the enclosure. The vapor level in the enclosure may be adjusted based on readings from the vapor sensor.

Figure 7:
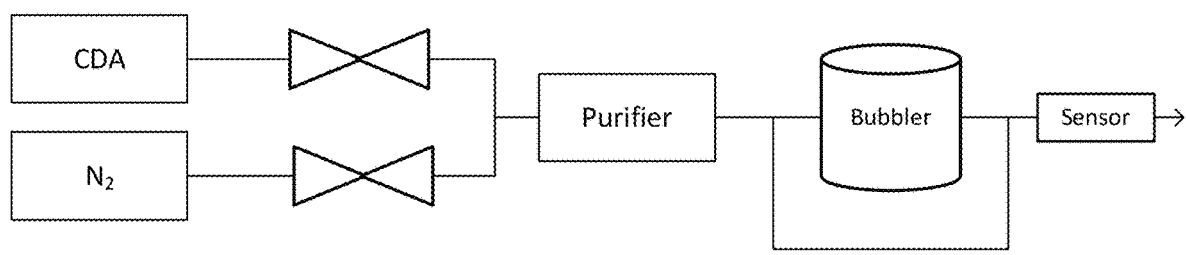
FIG. 7 is a diagram showing a test system.

FIG. 7 is a block diagram of an experiment using a test system. Clean dry air (CDA) and $N_2$ flow through separate needle valves to a purifier. The CDA and $N_2$ may be regulated to 30 psi. After the purifier, the CDA and $N_2$ flow to a bubbler and then a sensor, which can include an $O_2$ meter and a vapor sensor. The resulting gas is used as input and can be mixed with the vapor.

Figure 8:
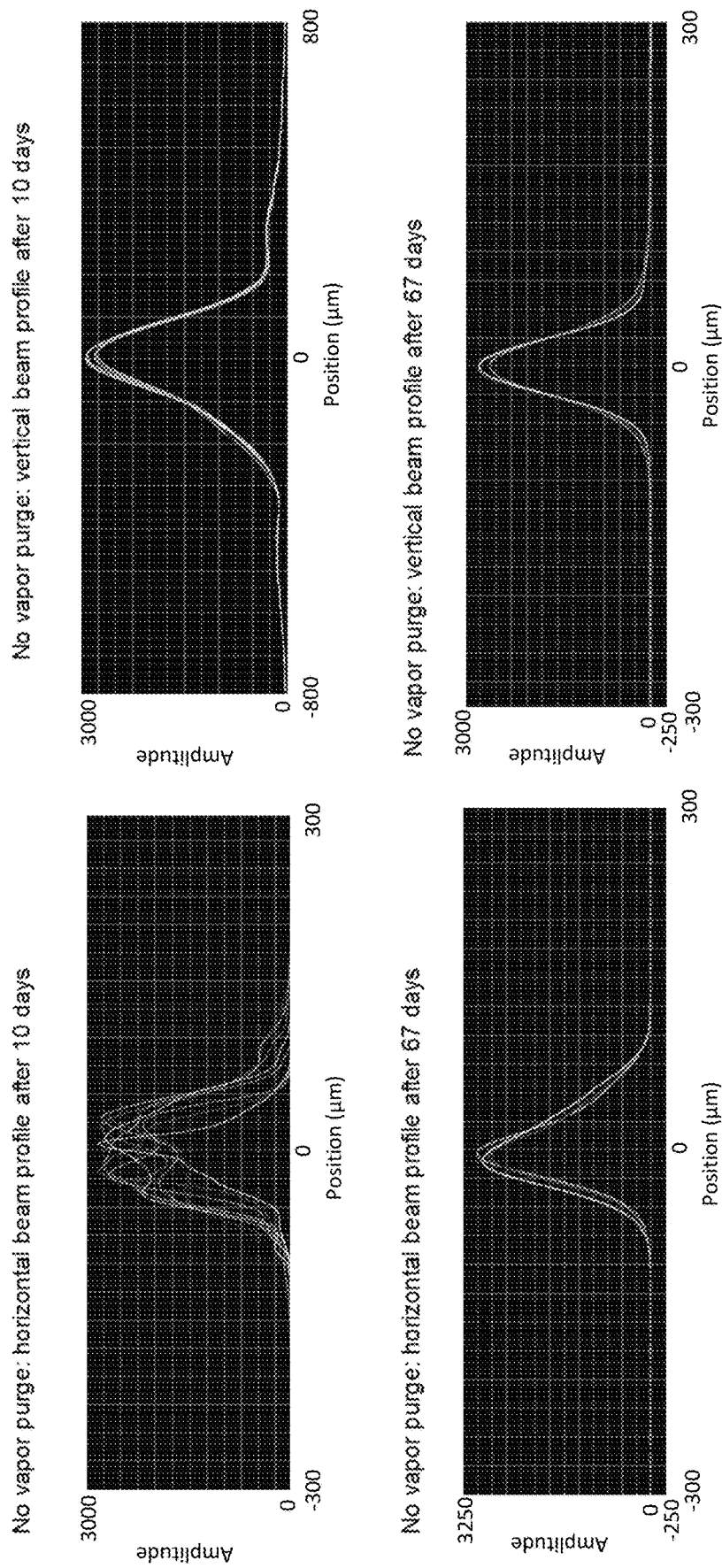
FIG. 8 shows that the beam shape is changing and resulting surface damage and oxidation for a $CaF_2$ optical component.

FIG. 8 shows that the beam shape is changing and resulting surface damage and oxidation for a $CaF_2$ optical component.

Figure 9:
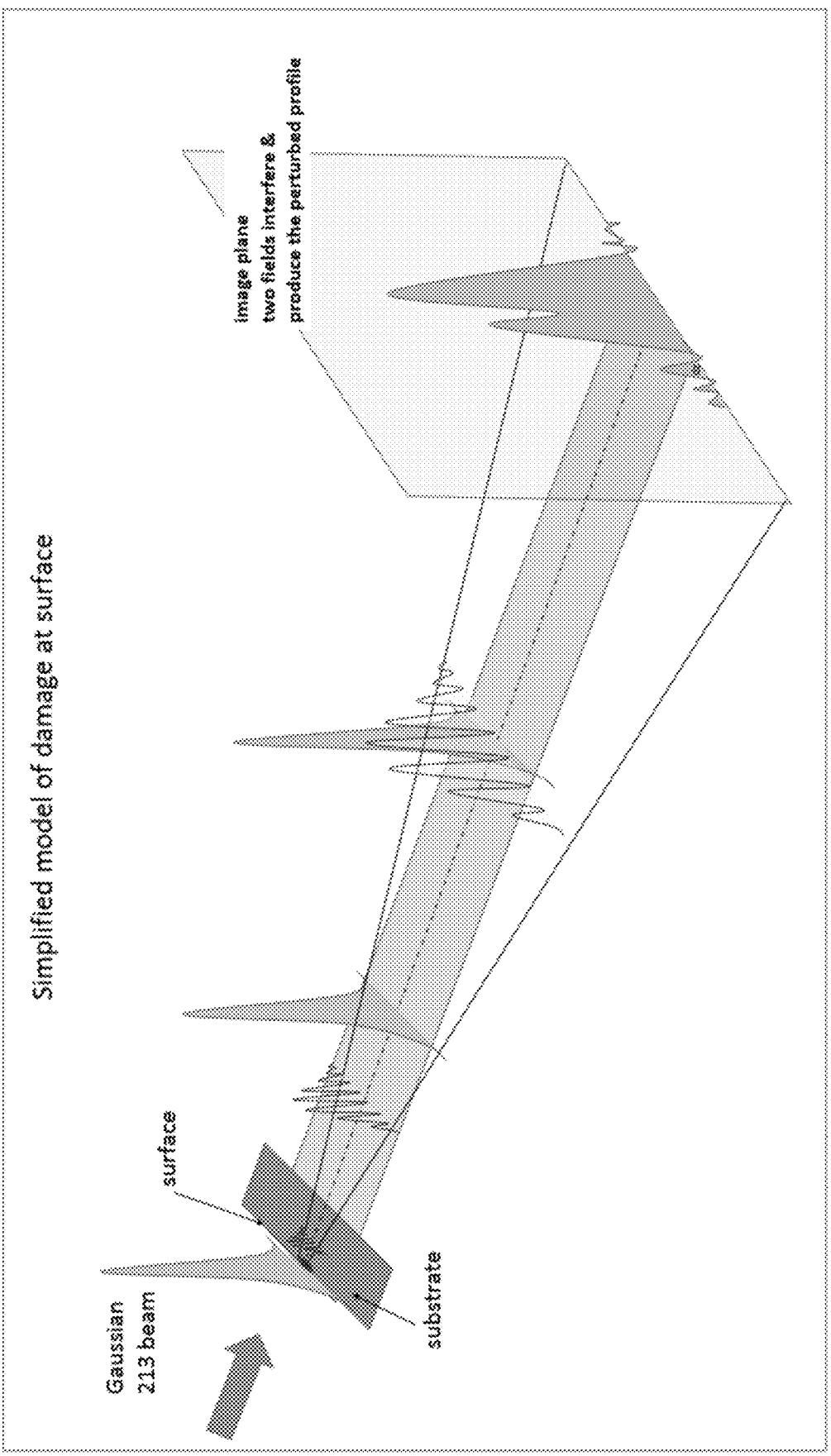
FIG. 9 illustrates a partially-damaged surface/subsurface.

FIG. 9 illustrates a partially-damaged surface/subsurface.

Figure 10:
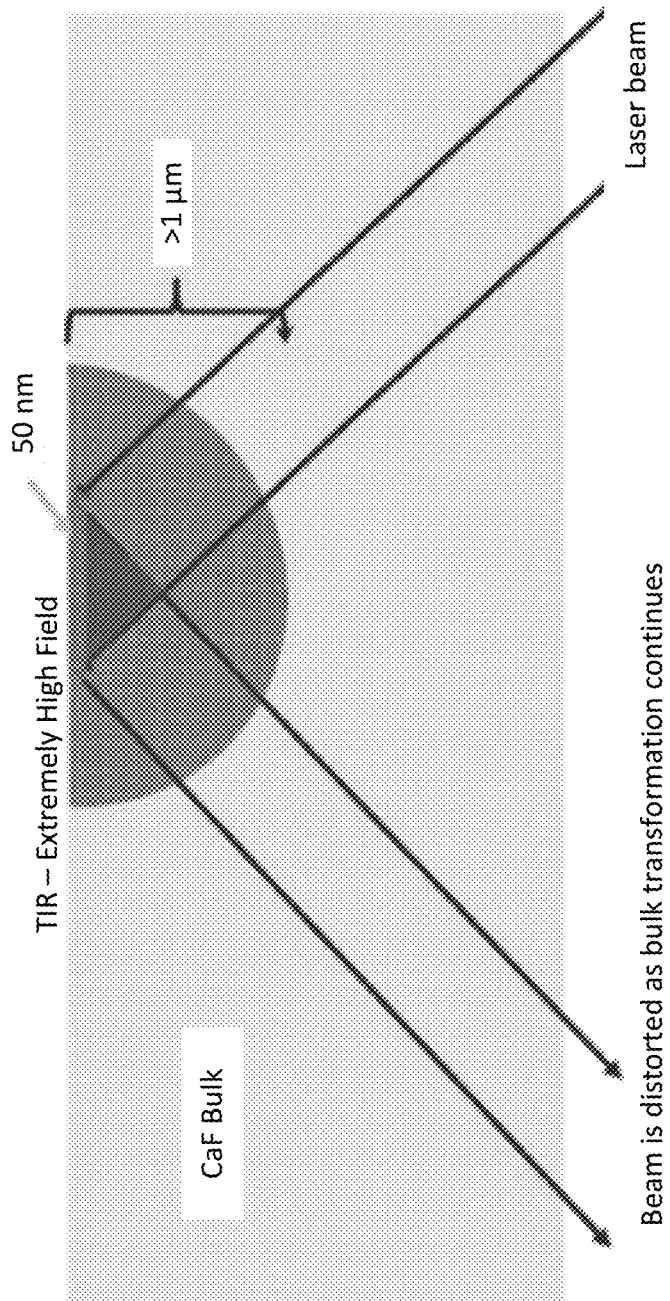
FIG. 10 is another illustration of $CaF_2$ damage.

FIG. 10 is another illustration of $CaF_2$ damage. As seen in FIG. 10, damage can lead to beam shape change.

Many polar molecules can be used as the vapor to arrest optics damage. For example, water, methanol, ethylene glycol, or ethanol may be used.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:
    an optical component, wherein the optical component is $CaF_2$;
    an enclosure surrounding the optical component; and
    a vapor source in fluid communication with the enclosure, wherein the vapor source provides a vapor to the enclosure with a vapor level from greater than or equal to 5000 ppm to 15000 ppm, wherein the vapor is one of water, methanol, ethylene glycol, or ethanol.

2. The system of claim 1, wherein the vapor is water.

3. The system of claim 1, wherein the vapor source includes a bubbler.

4. The system of claim 1, wherein the vapor source includes a permeable membrane, and wherein the permeable membrane includes Nafion or a polyamid.

5. The system of claim 1, wherein the vapor source includes a semi-permeable membrane.

6. The system of claim 1, wherein the vapor source includes a charge mosaic membrane or a bipolar membrane.

7. The system of claim 1, wherein the vapor source includes a gas source, wherein the gas source provides nitrogen, helium, carbon monoxide, carbon dioxide, krypton, argon, xenon, hydrogen, oxygen, compressed dry air, or a mixture thereof, wherein the gas from the gas source is mixed with the vapor.

8. The system of claim 1, further comprising a vapor sensor disposed in fluid communication with the enclosure, wherein the vapor sensor is one of a carbon monoxide detector, a carbon dioxide detector, a hygrometer, or a hydrogen sensor.

9. The system of claim 8, further comprising a processor in electronic communication with the vapor sensor, wherein the processor is configured to adjust the vapor level in purge gas from the enclosure based on readings from the vapor sensor.

10. A method comprising:
 flowing a vapor from a vapor source to an enclosure that surrounds an optical component, wherein the optical component is one of $CaF_2$; and
 maintaining a vapor level in the purge gas from greater than or equal to 5000 ppm to 15000 ppm, wherein the vapor is one of water, methanol, ethylene glycol, or ethanol.

11. The method of claim 10, further comprising measuring the vapor level in the enclosure using a vapor sensor disposed in the enclosure.

12. The method of claim 11, wherein the maintaining is based on readings from the vapor sensor.

\* \* \* \* \*